(12) United States Patent
Zhang et al.

(10) Patent No.: US 11,251,219 B2
(45) Date of Patent: Feb. 15, 2022

(54) LOW CAPACITANCE PHOTO DETECTORS

(71) Applicant: Sensors Unlimited, Inc., Princeton, NJ (US)

(72) Inventors: Wei Zhang, Princeton, NJ (US); Douglas Stewart Malchow, Lawrence, NJ (US); John Liobe, New York, NY (US); Michael J. Evans, Yardley, PA (US); Wei Huang, Plainsborough, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 16/814,179

(22) Filed: Mar. 10, 2020

(65) Prior Publication Data
US 2021/0288100 A1    Sep. 16, 2021

(51) Int. Cl.
| | | |
|---|---|---|
| *H01L 27/146* | (2006.01) | |
| *H01L 31/02* | (2006.01) | |
| *H01L 31/0216* | (2014.01) | |
| *H01L 31/0224* | (2006.01) | |
| *H01L 31/0304* | (2006.01) | |
| *H01L 31/105* | (2006.01) | |
| *H01L 31/107* | (2006.01) | |
| *H01L 31/18* | (2006.01) | |

(52) U.S. Cl.
CPC .... *H01L 27/14649* (2013.01); *H01L 27/1462* (2013.01); *H01L 27/14603* (2013.01); *H01L 27/14685* (2013.01); *H01L 27/14694* (2013.01); *H01L 31/02019* (2013.01); *H01L 31/02161* (2013.01); *H01L 31/022408* (2013.01); *H01L 31/03046* (2013.01); *H01L 31/105* (2013.01); *H01L 31/107* (2013.01); *H01L 31/1844* (2013.01)

(58) Field of Classification Search
CPC ......... H01L 27/14649; H01L 27/14685; H01L 27/14603; H01L 27/14694; H01L 24/1462; H01L 31/105; H01L 31/1844; H01L 31/02161; H01L 31/02019; H01L 31/107; H01L 31/022408; H01L 31/03046
See application file for complete search history.

(56) References Cited

U.S. PATENT DOCUMENTS

| | | |
|---|---|---|
| 7,902,540 B2 | 3/2011 | Cohen |
| 7,935,994 B2 | 5/2011 | Wang et al. |
| 8,895,343 B2 | 11/2014 | Peterson et al. |

(Continued)

FOREIGN PATENT DOCUMENTS

| | | |
|---|---|---|
| WO | 2010/151888 A1 | 12/2010 |
| WO | 2011/037517 A1 | 3/2011 |

OTHER PUBLICATIONS

Extended European Search report issued in EP 21161779, dated Jul. 5, 2021.

*Primary Examiner* — Sitaramarao S Yechuri
(74) *Attorney, Agent, or Firm* — Locke Lord LLP; Joshua L. Jones; Scott D. Wofsy

(57) ABSTRACT

A system includes a pixel having a diffusion layer within a cap layer. The diffusion layer defines a front side and an illumination side opposite the front side with an absorption layer operatively connected to the illumination side as well as the diffusion and cap layers. A set of alternating oxide and nitride layers are deposited on the front side of the cap and diffusion layers.

11 Claims, 4 Drawing Sheets

(56) References Cited

U.S. PATENT DOCUMENTS

| | | |
|---|---|---|
| 9,647,022 B2 | 5/2017 | Hung et al. |
| 10,032,814 B2 | 7/2018 | Yamashita |
| 2002/0027239 A1* | 3/2002 | Ohkubo ............ H01L 27/14692 |
| | | 257/292 |
| 2006/0105554 A1* | 5/2006 | Inada ................. H01L 31/1035 |
| | | 438/558 |
| 2007/0012948 A1 | 1/2007 | Dries et al. |
| 2008/0308891 A1* | 12/2008 | Boisvert ............... H01L 31/105 |
| | | 257/451 |
| 2010/0044677 A1* | 2/2010 | Nagai .................... B82Y 20/00 |
| | | 257/21 |
| 2012/0235267 A1* | 9/2012 | Larsson ................ H01L 31/107 |
| | | 257/432 |
| 2013/0032780 A1* | 2/2013 | Fujii ...................... B82Y 20/00 |
| | | 257/14 |
| 2013/0153962 A1* | 6/2013 | Sim ....................... H01L 31/107 |
| | | 257/186 |
| 2016/0126381 A1* | 5/2016 | Wang ...................... G02B 6/122 |
| | | 257/429 |
| 2019/0027528 A1* | 1/2019 | Yoshida ............... H01L 31/1868 |
| 2019/0191067 A1* | 6/2019 | Vaillant .................. G01S 17/894 |
| 2019/0244924 A1 | 8/2019 | Zhang et al. |
| 2020/0020734 A1 | 1/2020 | Wang et al. |

\* cited by examiner

LOW CAPACITANCE PHOTO DETECTORS

BACKGROUND

1. Field

The present disclosure relates to imaging devices, and more particularly to photo detectors such as for high speed sensing applications.

2. Description of Related Art

Low-capacitance photo detectors are desirable due to their high transient speed and low-noise levels, which are useful for photo detectors used in LIDAR and pulse-tracking applications. To achieve low capacitance, unique and complex designs of the diode epitaxial structures are used. This drives up costs for the epitaxial growth, diode fabrication processes and contact interfaces that are required. The photo detector's dark current may also be increased, causing high dark noise in both avalanche photodiode (APD) and high-speed PIN photo detectors.

The conventional techniques have been considered satisfactory for their intended purpose. However, there is an ever present need for improved systems and methods for low capacitance photodetectors. This disclosure provides a solution for this need.

SUMMARY

A system includes a pixel having a diffusion layer within a cap layer. The diffusion layer defines a front side and an illumination side opposite the front side with an absorption layer operatively connected to the illumination side of the diffusion and cap layers. A set of alternating oxide and nitride layers are deposited on the front side of the cap and diffusion layers.

The pixel can include a PIN diode structure wherein the diffusion layer is in contact with the absorption layer on the side of the cap and diffusion layers, wherein the set of alternating oxide and nitride layers is deposited on a side of the diffusion layer opposite the absorption layer. It is also contemplated that the pixel can include an avalanche photodiode (APD) structure wherein a field control layer is disposed in contact with the cap layer opposite from the set of alternating oxide and nitride layers, wherein a grading layer is disposed in contact with the field control layer opposite the cap layer, and wherein the grading layer is in contact with the absorption layer.

The pixel can be one of a plurality of similar pixels arranged in a grid pattern. The absorption layer can include InGaAs, wherein the pixel is sensitive to illumination in infrared wavelengths. The cap layer can include InP. A contact layer can be disposed in contact with the absorption layer on an illumination side of the absorption layer. The contact layer can include n-doped InP. An anti-reflective layer can be deposited on the contact layer opposite the absorption layer.

A contact metal can be electrically connected to the diffusion layer, configured to electrically connect the diffusion layer to a read-out integrated circuit (ROIC). The contact metal can have an aspect ratio (height to width) greater than 1 to 1 with a flat top surface, wherein height is measured perpendicular to a surface of the diffusion layer where the contact metal joins the diffusion layer, and wherein width is measured in a direction along the surface of the diffusion layer where the contact metal joins the diffusion layer. The contact metal can have an aspect ratio (height to width) greater than 2 to 1. The ROIC can be connected in electrical communication with the contact metal.

A method includes forming a pixel array including a plurality of pixels, each pixel including a diffusion layer operatively connected to an absorption layer. The method includes depositing a set of alternating oxide and nitride layers on a side of the diffusion layer opposite the absorption layer. Forming the pixel array can include forming an array of pixels wherein each pixel has a PIN architecture or an avalanche photodiode (APD) architecture.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
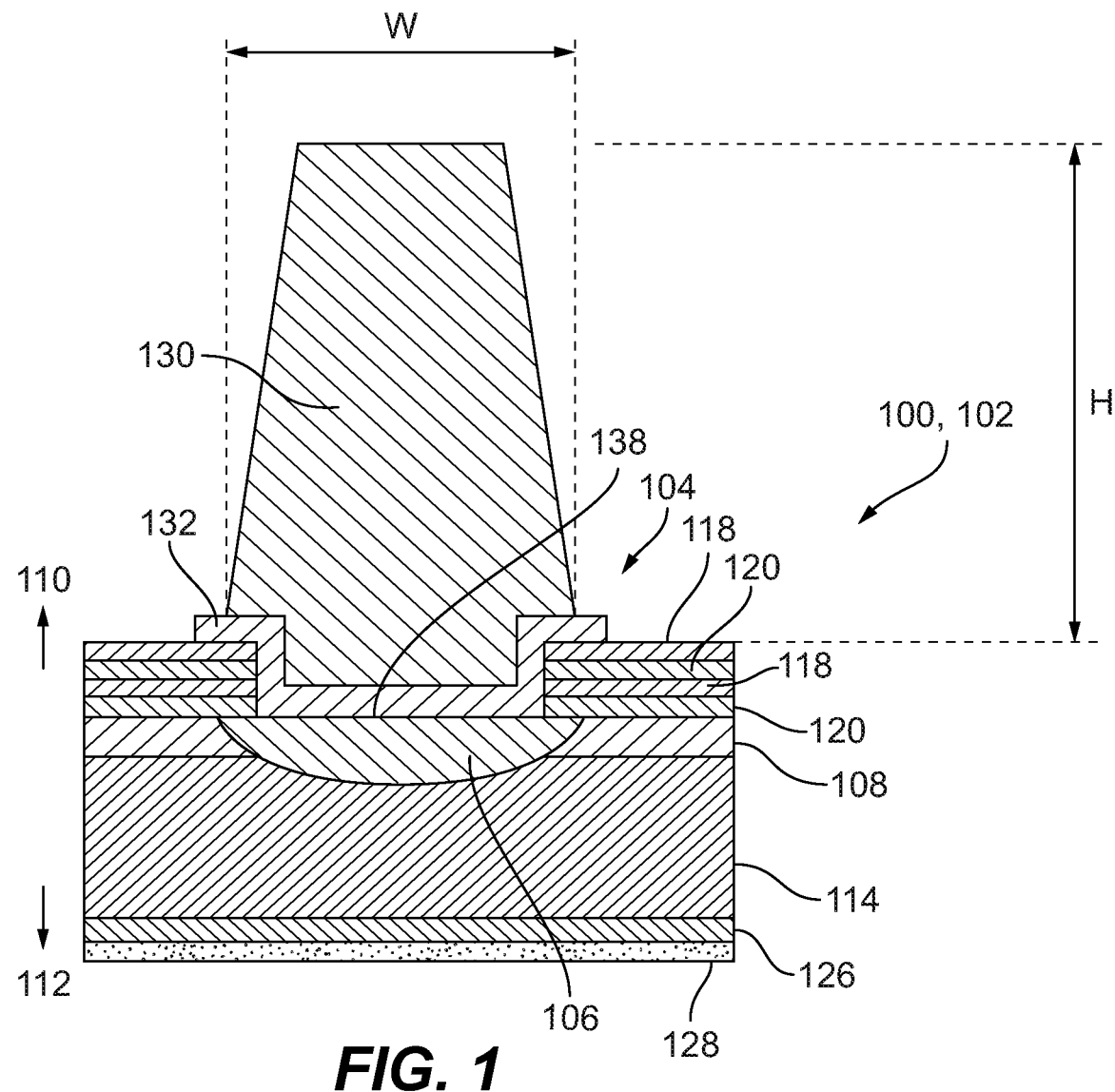
FIG. 1 is a schematic cross-sectional side elevation view of an embodiment of a system constructed in accordance with the present disclosure, showing the pixel with a PIN architecture.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIGS. 2-4, as will be described. The systems and methods described herein can be used to reduce capacitance created by the passivation layer in photodiodes, increasing thickness of the passivation layer without increasing the mechanical stress relative to traditional photodetector configurations.

A system includes a photodiode array (PDA) 102 one pixel 104 of which is shown in FIG. 1. The pixel 104 has a diffusion layer 106 within an InP cap layer 108. The diffusion layer 106 defines a front side 110 and an illumination side 112 opposite the front side 110. An absorption layer 114 is operatively connected to the illumination side 112 of the diffusion and cap layers 106, 108. The absorption layer 114 can include InGaAs, wherein the pixel is sensitive to illumination in infrared wavelengths. A set 116 of oxide layers 118 alternating with nitride layers 120 are deposited on the front side 110 of the cap and diffusion layers 106, 108.

The pixel 104 shown in FIG. 1 has a PIN diode structure wherein the diffusion layer 106 is in contact with the absorption layer 114 on the side of the cap and diffusion layers 108, 106. The set 116 of alternating oxide and nitride layers 118, 120 is deposited on a side of the diffusion layer 106 opposite the absorption layer 114. It is also contemplated that the pixel 104 can include an avalanche photodiode (APD) structure as shown in FIG. 3, wherein a field control layer 122 is disposed in contact with the cap layer 108 opposite from the set 116 of alternating oxide and nitride layers 118, 120, wherein a grading layer 124 is disposed in contact with the field control layer 122 opposite the cap layer 108, and wherein the grading layer 124 is in contact with the absorption layer 114.

Figure 3:
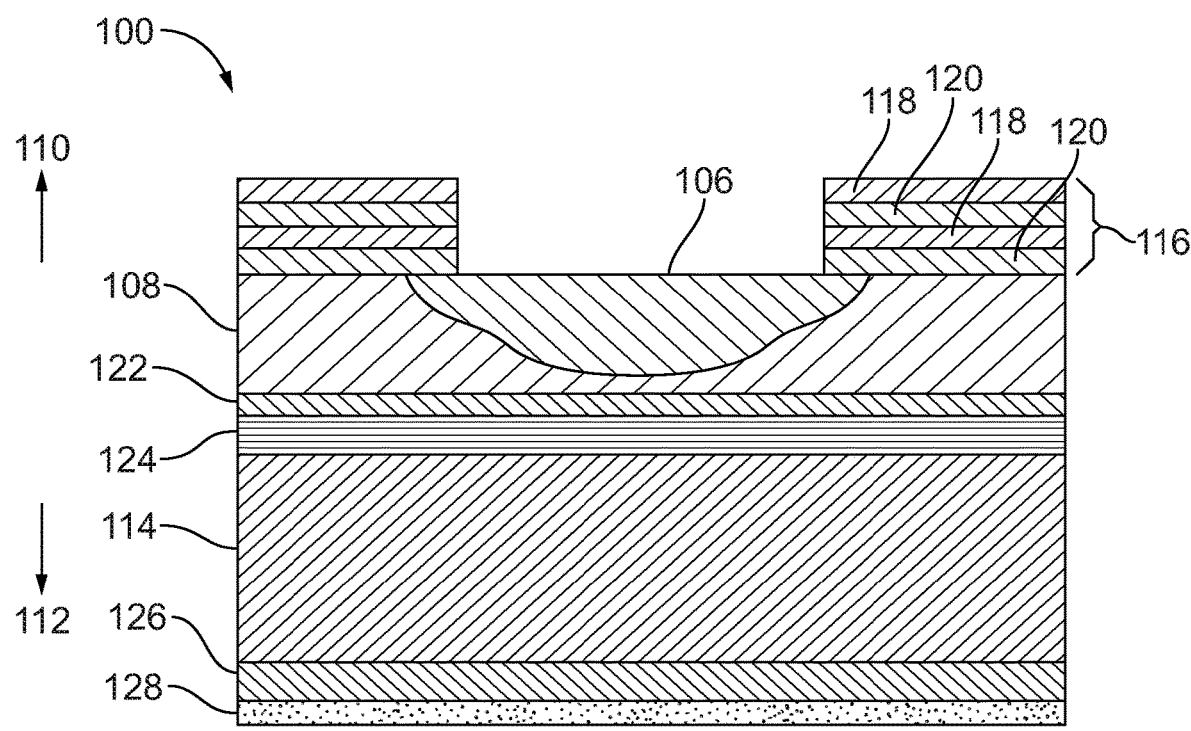
FIG. 3 is a schematic cross-sectional side elevation view of another embodiment of a system constructed in accordance with the present disclosure, showing the pixel with an avalanche photodiode (APD) architecture.
Figure 4:
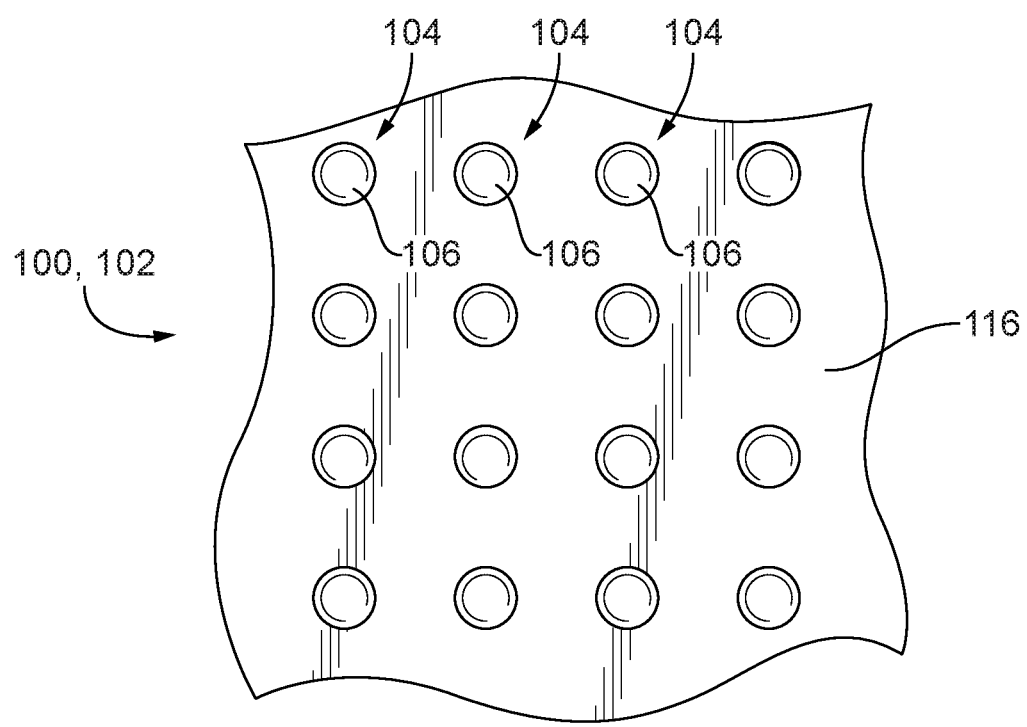
FIG. 4 is a plan view of the system of FIG. 1 or 3, showing an array of pixels.

With reference to FIG. 4, regardless of whether an APD or PIN architecture is used, the PDA 102 includes a plurality of similar pixels 104 arranged in a grid pattern. Regardless of whether an APD (FIG. 3) or PIN (FIG. 1) architecture is used, contact layer 126 can be disposed in contact with the absorption layer 114 on an illumination side 112 of the absorption layer 114. The contact layer 126 can include n-doped InP. An anti-reflective layer 128 can be deposited on the contact layer 126 opposite the absorption layer 114.

Figure 2:
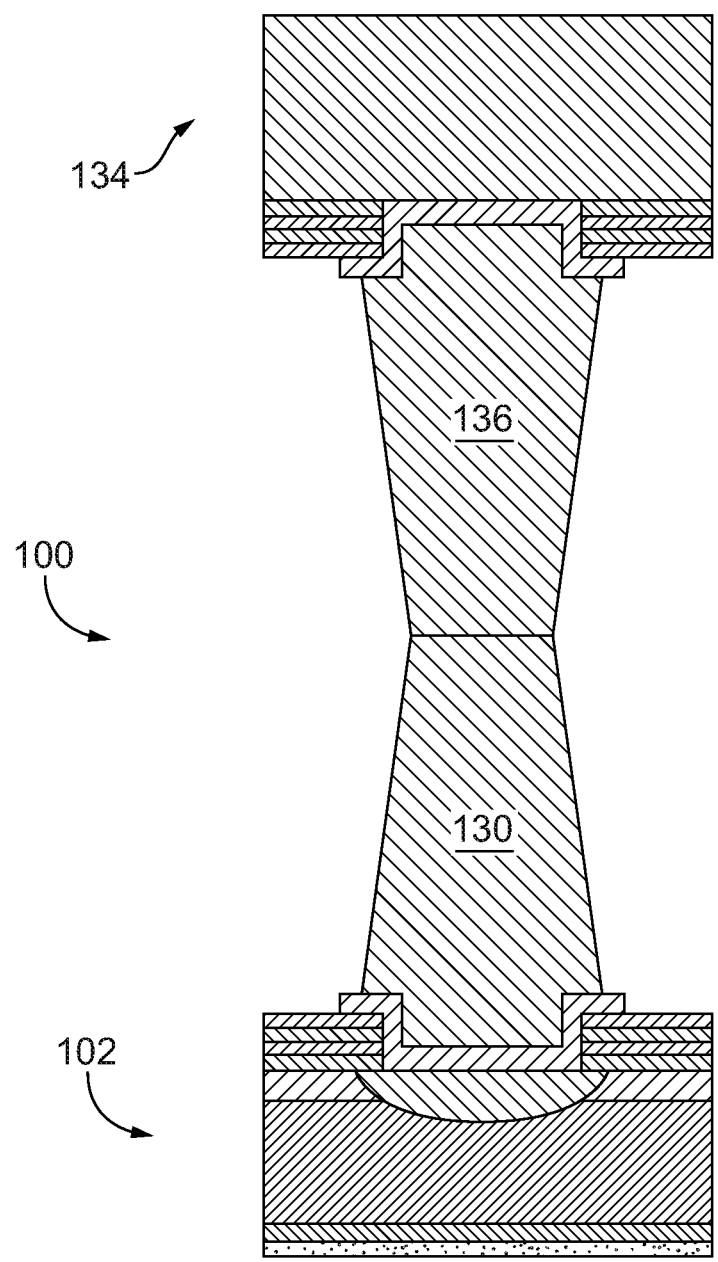
FIG. 2 is a schematic cross-sectional side elevation view of the system of FIG. 1, showing the ROIC connected to the photodiode array (PDA)

With reference again to FIG. 1 (and regardless of whether the PIN architecture of FIG. 1 or the APD architecture of FIG. 3 is used), a contact metal 130 (e.g., of Indium) can be electrically connected to the diffusion layer 106 through a bump-to-stack contact layer 132 which physically separates between the contact metal 130 and the diffusion layer 106 and set 116 of alternating layers 118, 120. The contact metal 130 is configured to electrically connect the diffusion layer 106 to a read-out integrated circuit (ROIC) 134 through a corresponding contact metal 136 of the ROIC, as shown in FIG. 2. The contact metal 130 can have an aspect ratio (height H to width W) greater than 1 to 1 wherein height H is measured from the bottom surface of the contact metal 130 to the top surface of the contact metal 130 (as oriented in FIG. 1), i.e. perpendicular to a surface 138 of the diffusion layer 106 where the contact metal 130 joins the diffusion layer 106 (albeit joined by the contact layer 132), and wherein width W is measured in a direction along the surface 138 of the diffusion layer. The contact metal 130 can have an aspect ratio (height to width) greater than 2 to 1, even when the ROIC 134 is connected in electrical communication with the contact metal 130 as shown in FIG. 2. The contact metal 130, 136 (e.g. Indium bumps) also have flat top surface (e.g. as oriented in FIG. 1), which favors the alignment and hybridization of PDA 102 and ROIC 134. High press pressure can be avoided in this case, which will reduce the lateral expansion of the indium metal during press. So that the metal foot print is decreased, device capacitance will be reduced comparing with the prior art.

A method includes forming a pixel array, e.g., the photodiode array (PDA) 102 in FIG. 4, including a plurality of pixels e.g pixels 104, each pixel including a diffusion layer, e.g., diffusion layer 106, operatively connected to an absorption layer, e.g. absorption layer 114. The method includes depositing a set of alternating oxide and nitride layers, e.g., layers 118, 120, on a side of the diffusion layer opposite the absorption layer. Forming the pixel array can include forming an array of pixels wherein each pixel has a PIN architecture (as shown in FIG. 1) or an avalanche photodiode (APD) architecture (as shown in FIG. 3).

The configurations shown herein with the alternating oxide and nitride layers 118, 120 can reduce photodiode capacitance, which can reduce detector kTC noise (the noise component of the charge/discharge noise may not be constant). This improves signal detection and imaging sensitivity. For a given overall thickness, the layers 118, 120 can induce lower stress on the underlying layers, allowing for a greater overall thickness compared to traditional dielectric passivation layers. For both PIN and APD architectures, the capacitance reduction can also improve detector pulse response by reducing time constants giving better timing accuracy and sensitivity for weak-returned pulses in LIDAR systems. For such arrays, having a high-aspect-ratio bump design can also reduce unwanted capacitance to improve yield and can reduce costs via manufacturing efficiency and array uniformity.

The methods and systems of the present disclosure, as described above and shown in the drawings, provide for reduced capacitance created by the passivation layer in photodiodes, and/or increasing thickness of the passivation layer without increasing the mechanical stress relative to traditional photodetector configurations. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system comprising:
   a pixel including a diffusion layer within a cap layer, wherein the diffusion layer defines a front side and an illumination side opposite the front side with an absorption layer operatively connected to the illumination side as well as the diffusion and cap layers; and
   a set of alternating oxide and nitride layers deposited on the front side of the cap and diffusion layers, wherein the pixel includes an avalanche photodiode (APD) structure wherein a field control layer is disposed in contact with the cap layer opposite from the set of alternating oxide and nitride layers, wherein a grading layer is disposed in contact with the field control layer opposite the cap layer, and wherein the grading layer is in contact with the absorption layer.

2. The system as recited in claim 1, wherein the cap layer includes InP.

3. The system as recited in claim 1, further comprising a contact layer disposed in contact with the absorption layer on an illumination side of the absorption layer.

4. The system as recited in claim 3, wherein the contact layer includes n-doped InP.

5. The system as recited in claim 3, further comprising an anti-reflective layer deposited on the contact layer opposite the absorption layer.

6. The system as recited in claim 1, further comprising a contact metal electrically connected to the diffusion layer, configured to electrically connect the diffusion layer to a read-out integrated circuit (ROIC).

7. The system as recited in claim 6, wherein the contact metal has an aspect ratio (height to width) greater than 1 to 1 with a flat top surface, wherein height is measured perpendicular to a surface of the diffusion layer where the contact metal joins the diffusion layer, and wherein width is measured in a direction along the surface of the diffusion layer where the contact metal joins the diffusion layer.

8. The system as recited in claim 7, wherein the contact metal has an aspect ratio (height to width) greater than 2 to 1.

9. The system as recited in claim 7, further comprising the ROIC connected in electrical communication with the contact metal.

10. The system as recited in claim 1, wherein the absorption layer includes InGaAs, and wherein the pixel is sensitive to illumination in infrared wavelengths.

11. A system as recited in claim 1, wherein the pixel is one of a plurality of similar pixels arranged in a grid pattern.

\* \* \* \* \*